(12) United States Patent
Friel et al.

(10) Patent No.: US 12,065,756 B2
(45) Date of Patent: Aug. 20, 2024

(54) METHOD OF MANUFACTURE OF SINGLE CRYSTAL SYNTHETIC DIAMOND MATERIAL

(71) Applicant: ELEMENT SIX TECHNOLOGIES LIMITED, Didcot (GB)

(72) Inventors: Ian Friel, Didcot (GB); Katharine Louise Atkinson, Didcot (GB); Daniel James Twitchen, Didcot (GB)

(73) Assignee: Element Six Technologies Limited, Didcot (GB)

( * ) Notice: Subject to any disclaimer, the term of this patent is extended or adjusted under 35 U.S.C. 154(b) by 0 days.

(21) Appl. No.: 18/143,557

(22) Filed: May 4, 2023

(65) Prior Publication Data

US 2023/0272551 A1    Aug. 31, 2023

Related U.S. Application Data

(63) Continuation of application No. 17/258,080, filed as application No. PCT/EP2019/068125 on Jul. 5, 2019, now Pat. No. 11,643,750.

(30) Foreign Application Priority Data

Jul. 6, 2018    (GB) ..................... 1811162

(51) Int. Cl.
  *C30B 25/16*    (2006.01)
  *C30B 25/10*    (2006.01)
  (Continued)

(52) U.S. Cl.
  CPC .......... *C30B 25/205* (2013.01); *C30B 25/105* (2013.01); *C30B 25/16* (2013.01); *C30B 29/04* (2013.01)

(58) Field of Classification Search
  CPC ....... C30B 29/04; C30B 25/205; C30B 25/05; C30B 25/16; C01B 32/25
  See application file for complete search history.

(56) References Cited

U.S. PATENT DOCUMENTS 7,396,408 B2    7/2008   Schreck et al.
9,359,693 B2    6/2016   Francis et al.
(Continued)

FOREIGN PATENT DOCUMENTS

DE    102010023952 A1    12/2011
EP        3211657 A2     8/2017
(Continued)

OTHER PUBLICATIONS

U.S. Appl. No. 17/258,080 , "Final Office Action", Aug. 26, 2022, 7 pages.
U.S. Appl. No. 17/258,080 , "Non-Final Office Action", Mar. 31, 2022, 8 pages.
(Continued)

*Primary Examiner* — Robert M Kunemund
(74) *Attorney, Agent, or Firm* — Kilpatrick Townsend & Stockton LLP

(57) ABSTRACT

A method of manufacturing synthetic diamond material using a chemical vapour deposition process, and a diamond obtained by such a method are described. The method comprises providing a freestanding synthetic single crystal diamond substrate wafer having a dislocation density of at least $10^7$ cm$^{-2}$. The synthetic single crystal diamond substrate wafer is located over a substrate holder within a chemical vapour deposition reactor. Process gases are fed into the reactor, the process gases including a gas comprising carbon. Crack-free synthetic diamond material is grown on a surface of the single crystal diamond substrate wafer at a temperature of at least 900° C. to a thickness of at least 0.5 mm and with lateral dimensions of at least 4 mm by 4 mm.

9 Claims, 2 Drawing Sheets

```
S5. Locate non-diamond substrate over substrate holder
                    ↓
S6. Feed process gases into reactor
                    ↓
S7. Heteroepitaxially grow synthetic
    diamond substrate wafer
```

(51) Int. Cl.
*C30B 25/20* (2006.01)
*C30B 29/04* (2006.01)

(56) References Cited

U.S. PATENT DOCUMENTS

| 11,643,750 | B2* | 5/2023 | Friel | C30B 25/105 |
| | | | | 117/103 |
| 2010/0242834 | A1 | 9/2010 | Bhandari | |
| 2011/0150745 | A1 | 6/2011 | Twitchen et al. | |
| 2012/0168773 | A1 | 7/2012 | Sung | |
| 2021/0285125 | A1 | 9/2021 | Friel et al. | |

FOREIGN PATENT DOCUMENTS

| GB | 2486794 A | 6/2012 |
| GB | 2510269 A | 7/2014 |
| WO | 03052177 A1 | 6/2003 |
| WO | 2004027123 A1 | 4/2004 |
| WO | 2004045427 A1 | 6/2004 |
| WO | 2007066215 A2 | 6/2007 |
| WO | 2010010352 A1 | 1/2010 |
| WO | 2012084656 A1 | 6/2012 |

OTHER PUBLICATIONS

U.S. Appl. No. 17/258,080, "Notice of Allowance", Feb. 8, 2023, 7 pages.
U.S. Appl. No. 17/258,080, "Supplemental Notice of Allowability", Mar. 1, 2023, 4 pages.
Friel et al., "Control of surface and bulk crystalline quality in single crystal diamond grown by chemical vapour deposition," Diamond and Related Materials, 2009, pp. 808-815, vol. 18, Elsevier BV.
United Kingdom Patent Application No. GB1811162.5, Combined Search and Examination Report dated Sep. 20, 2018, 9 pages.
United Kingdom Patent Application No. GB1909676.7, Combined Search and Examination Report dated Aug. 14, 2019, 8 pages.
International Patent Application No. PCT/EP2019/068125, International Search Report and Written Opinion dated Sep. 12, 2019, 16 pages.
Schermer et al., "Flame deposition and characterization of large type IIA diamond single crystals," Diamond and Related Materials, Apr. 1994, pp. 408-416, vol. 3, Issues 4-6, Elsevier BV.
Schrek et al., "Diamond nucleation on iridium buffer layers and subsequent textured growth: A route for the realization of single-crystal diamond films," Applied Physics Letters, Jan. 8, 2001, pp. 192-194, vol. 78, No. 2, American Institute of Physics.
Silva et al., "Geometric modeling of homoepitaxial CVD diamond growth: I. The $\{1\ 0\ 0\}\{1\ 1\ 1\}\{1\ 1\ 0\}\{1\ 1\ 3\}$ system," Journal of Crystal Growth, 2008, pp. 187-203, vol. 310, Elsevier BV.

\* cited by examiner

METHOD OF MANUFACTURE OF SINGLE CRYSTAL SYNTHETIC DIAMOND MATERIAL

CROSS-REFERENCE TO RELATED APPLICATIONS

This application is a continuation of and claims priority to U.S. patent application Ser. No. 17/258,080 filed on Jan. 5, 2021, now U.S. Pat. No. 11,643,750 which is a U.S. national phase of International Patent Application No. PCT/EP2019/068125, filed on Jul. 5, 2019, which claims the benefit of United Kingdom Patent Application No. 1811162.5, filed on Jul. 6, 2018, each of which is incorporated herein by reference in its entirety.

FIELD

The invention relates to the field of manufacturing single crystal synthetic diamond material, in particular single crystal synthetic diamond material manufactured using a Chemical Vapour Deposition (CVD) method.

BACKGROUND

Diamond materials may be categorized into three main types: natural diamond materials; HPHT (high pressure high temperature) synthetic diamond materials, and CVD (chemical vapour deposited) synthetic diamond materials. These categories reflect the way in which the diamond materials are formed. Furthermore, these categories reflect the structural and functional characteristics of the materials. This is because while natural, HPHT synthetic, and CVD synthetic diamond materials are all based on a theoretically perfect diamond lattice the defects in these material are not the same. For example, CVD synthetic diamond contains many defects unique to the process of CVD, and whilst some defects are found in other diamond forms, their relative concentration and contribution is very different. As such, CVD synthetic diamond materials are different to both natural and HPHT synthetic diamond materials.

Diamond materials may also be categorized according to their physical form. In this regard, diamond materials may be categorized into three main types: single crystal diamond materials; polycrystalline diamond materials; and composite diamond materials. Single crystal diamond materials are in the form of individual single crystals of various sizes ranging from small "grit" particles used in abrasive applications through to large single crystals suitable for use in a variety of technical applications as well for gemstones in jewellery applications. Polycrystalline diamond materials are in the form of a plurality of small diamond crystals bonded together by diamond-to-diamond bonding to form a polycrystalline body of diamond material such as a polycrystalline diamond wafer. Such polycrystalline diamond materials can be useful in various applications including thermal management substrates, optical windows, and mechanical applications. Composite diamond materials are generally in the form of a plurality of small diamond crystals bonded together by diamond-to-diamond or a non-diamond matrix to form a body of composite material. Various diamond composites are known including diamond containing metal matrix composites, particularly cobalt metal matrix composites known as polycrystalline diamond (PCD), and skeleton cemented diamond (ScD) which is a composite comprising silicon, silicon carbide, and diamond particles.

It should also be appreciated that within each of the aforementioned categories there is much scope for engineering diamond materials to have particular concentrations and distributions of defects in order to tailor diamond materials to have particular desirable properties for particular applications. The present disclosure is concerned with CVD single crystal synthetic diamond materials.

CVD processes for synthesis of diamond material are well known. Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, CVD synthetic diamond material can be deposited. Polycrystalline CVD diamond material may be formed on a non-diamond substrate such as a refractory metal or silicon substrate. Single crystal CVD synthetic diamond material may be formed by homoepitaxial growth on a single crystal diamond substrate.

Atomic hydrogen present in the process selectively etches off non-diamond carbon from the substrate such that diamond growth can occur. Various methods are available for heating carbon containing gas species and molecular hydrogen in order to generate the reactive carbon containing radicals and atomic hydrogen required for CVD synthetic diamond growth including arc-jet, hot filament, DC arc, oxy-acetylene flame, and microwave plasma.

A problem with prior art methodologies is how to achieve large area single crystal CVD synthetic diamond material. It has been found that large area single crystal diamond can be grown by a process known as "heteroepitaxial growth". This is where diamond nucleates and grows epitaxially on a non-diamond substrate. Iridium has been found to be a suitable substrate to allow diamond nucleation and growth, but other substrates such as silicon, silicon carbide, copper, nickel, rhenium and titanium carbide have been investigated. U.S. Pat. No. 7,396,408 describes such a process. In this case, diamond is grown in a CVD process using a silicon carbide or silicon single crystal wafer that has a layer of iridium deposited on its surface. This is used as a substrate on which to heteroepitaxially deposit and grow diamond. During the growth process, diamond crystallites nucleate on the iridium film. These crystallites grow and merge to form a single crystal layer, which is continued until a single crystal diamond wafer of the desired thickness is formed. Typically, the dislocation density reduces via dislocation interactions (fusion and annihilation) as growth proceeds, leading to a single crystal diamond wafer that has a higher dislocation density adjacent to the original nucleation face compared to the growth face.

A problem with large area single crystal diamond growth using a heteroepitaxial growth method is that the crystal lattice parameter mismatch between the iridium (or other substrate) and the grown diamond causes a high dislocation density in the resultant diamond wafer which, even after the annihilation and fusion of dislocations in the early stages of growth, can still be of an order typically observed in natural type IIa diamonds (around $10^7$ cm$^{-2}$ and greater). Such a high density of dislocations can be detrimental for certain industrial applications of CVD diamond, such as low birefringence optical windows, ruling out the direct use of heteroepitaxially grown CVD diamond for such applications.

A further problem is that the substrate materials used for heteroepitaxial growth can lead to an undesirable incorporation of impurities into the grown diamond lattice, such as silicon.

It may further be the case that the growth conditions required to grow high quality grades of CVD diamond (such as a high microwave power density), are incompatible with the substrate materials used for heteroepitaxial growth. For example, the use of a silicon substrate, with its relatively low thermal conductivity (compared to that of diamond), can set a practical limit on the CVD process power density, since higher power densities lead to higher heat fluxes. These can in turn generate thermal gradients within the silicon wafer, which lead to its mechanical failure.

SUMMARY

For certain applications of CVD diamond requiring large area single crystals, it is therefore desirable to provide a process for growing on a heteroepitaxially grown single crystal CVD diamond wafer previously detached from its non-diamond substrate. Such a process allows the aforementioned problems to be solved: methods for reducing the CVD diamond dislocation density can be employed (such as those outlined in WO2004/027123); undesirable incorporation of impurities from the use of non-diamond substrates such as silicon is avoided; and practical limitations to CVD process parameters due to the use of non-diamond substrates are alleviated.

However, it is known from prior art that CVD diamond growth on single crystal substrates with a high density of dislocations, such as those manufactured from type IIa natural diamond, or from heteroepitaxially grown CVD diamond, can lead to undesirable crack formation, and/or an undesirable transition from single crystal to polycrystalline diamond (see for example, Diamond and Related Materials, Volume 3, Issues 4-6, April 1994, Pages 408-416). Such undesirable effects can occur even for CVD diamond layers grown relatively thinly (around 0.5 mm). It is therefore desirable to provide a process for growing relatively thick, crack-free single crystal CVD diamond on single crystal diamond substrates with a high density of dislocations, such as heteroepitaxially grown CVD diamond substrates.

It is an object of the present invention to provide a process for growing single crystal CVD diamond with a thickness of at least 0.5 mm thick which is substantially crack-free, on a single crystal diamond substrate with a high density of dislocations.

According to a first aspect, there is provided a method of manufacturing synthetic diamond material using a chemical vapour deposition process. The method comprises providing a freestanding synthetic single crystal diamond substrate wafer having a dislocation density of at least $10^7$ cm$^{-2}$. The synthetic single crystal diamond substrate wafer is located over a substrate holder within a chemical vapour deposition reactor. Process gases are fed into the reactor, the process gases including a gas comprising carbon. Crack-free synthetic diamond material is grown on a surface of the single crystal diamond substrate wafer at a temperature of at least 900° C. to a thickness of at least 0.5 mm and with lateral dimensions of at least 4 mm by 4 mm.

As an option, the growth conditions are maintained to provide an alpha growth parameter of no more than 2 or no more than 1.4.

The process gases optionally include hydrogen and not more than 5% oxygen.

The method optionally further comprises the step of growing the single crystal diamond substrate wafer heteroepitaxially.

A power density sufficient to achieve a growth rate is optionally selected from any of at least 4 µm per hour, at least 5 µm per hour, at least 10 µm per hour and at least 15 µm per hour.

As an option, the method further comprises providing the synthetic single crystal diamond substrate wafer by the steps of locating a non-diamond substrate over a substrate holder within a further reactor, the substrate comprising a surface on which the synthetic single crystal diamond substrate wafer is to be grown heteroepitaxially, feeding process gases into the further reactor, and growing the synthetic single crystal diamond substrate wafer on the surface of the non-diamond substrate.

As a further option, the reactor is the further reactor; in other words, the heteroepitaxially grown diamond substrate wafer may be grown in the same reactor as the synthetic diamond material, or it may be grown in a separate reactor.

As a further option, the non-diamond substrate comprises any of iridium, silicon and silicon carbide. Any suitable non-diamond substrate may be used.

As a further option, the method comprises removing a non-diamond substrate from the synthetic single crystal diamond substrate wafer prior to locating the synthetic single crystal diamond substrate wafer over the substrate holder. This minimises any contaminants in the grown synthetic diamond material that would otherwise arise from the non-diamond substrate.

As an option, the method further comprises, prior to locating the synthetic single crystal diamond substrate wafer over the substrate holder within the reactor, processing a surface of the synthetic single crystal diamond substrate wafer to reduce surface damage. Optional examples of surface processing include polishing, chemical mechanical polishing, etching, and laser processing.

The grown synthetic diamond material is optionally oriented at substantially {100} relative to the synthetic single crystal diamond substrate wafer. However. It will be appreciated that the substrate may be oriented at any desired angle to present a desired crystallographic plane to the growth surface of the single crystal diamond substrate wafer.

The single crystal diamond substrate wafer is optionally located on at least one spacer element disposed between the substrate holder and the synthetic single crystal diamond substrate wafer to form a gas gap, wherein gas is supplied to the gas gap, and wherein a flow rate of said gas is controlled to be no more than 5%, 4%, 3%, 2%, or 1% of a flow rate of the process gas fed into the reactor. This allows for improved temperature control. As a further option, the gas supplied to the gas gap is composed of gas types which are also fed into the reactor as process gases.

The reactor is optionally operated at a power density in the range 150 to 600 Wcm$^{-2}$ of the surface of the substrate.

The synthetic diamond material optionally has an area ranging from 16 mm$^2$ to 18000 mm$^2$.

The reactor substrate holder may require re-processing between synthetic diamond growth runs in order to maintain a profile of a supporting surface of the substrate holder.

The height of the substrate holder within the reactor is optionally adjusted between synthetic diamond growth runs to account for material removed from the substrate holder by re-processing and maintain a substantially constant height of the surface of the substrate within the reactor during subsequent synthetic diamond growth runs utilizing the same substrate holder. The height of the surface is maintained within either 2 mm, 1 mm, 0.8 mm, 0.5 mm, 0.3 mm, or 0.2 mm of a target height of the surface of the substrate within the reactor.

As an option, the reactor is inverted whereby a base of the reactor supporting the substrate forms an upper wall of the reactor relative to earth.

As an option, the growth temperature is selected from any of at least 925° C., at least 950° C., at least 1000° C. and at least 1050° C.

According to a second aspect, there is provided a CVD single crystal diamond comprising an intrinsic dislocation density of at least $10^7$ cm$^{-2}$, a thickness of at least 0.5 mm, a largest linear dimension of at least 4 mm, and a silicon concentration of no more than $5\times10^{17}$ atoms/cm$^3$.

As an option, the silicon concentration is selected from no more than $10^{17}$ atoms/cm$^3$, no more than $5\times10^{16}$ atoms/cm$^3$, and no more than $10^{17}$ atoms/cm$^3$.

As an option, the CVD single crystal diamond is heteroepitaxially grown.

As an option, the CVD single crystal diamond has:
a low optical birefringence, indicative of low strain, such that when a sample of the material is prepared as an optical plate having a thickness of at least 0.5 mm thickness and measured at room temperature, nominally 20° C., over an area having a largest linear dimension of at least 25 mm, |sin δ|, the modulus of the sine of the phase shift, for at least 98% of the measured area of the sample remains in first order, such that δ does not exceeding π/2, and |sin δ| does not exceed 0.9; and
a low and uniform optical absorption such that a sample of a specified thickness of at least 0.5 mm has an optical absorption coefficient at a wavelength of 1.06 μm of less than 0.09 cm$^{-1}$.

The CVD single crystal diamond material optionally has a largest linear dimension of is at least 25 mm or at least 100 mm.

As an option, |sin δ| does not exceed 0.9 over 100% of the measured area of the sample.

The CVD single crystal diamond material optionally comprises a single substitutional nitrogen concentration as measured by electron paramagnetic resonance (EPR) of at least $1\times10^{13}$ atoms cm$^{-3}$ and no more than $5\times10^{18}$ cm$^{-3}$. As a further option, the single substitutional nitrogen concentration as measured by electron paramagnetic resonance (EPR) is at least $3\times10^{15}$ atoms cm$^{-3}$ and no more than $5\times10^{17}$ cm$^{-3}$.

As an option, the CVD single crystal diamond material displays a 737 nm photoluminescence to Raman peak area ratio when excited using a 660 nm laser excitation source at 77 K selected from any of less than 10, less than 5, less than 1 and less than 0.1. This indicates a very low presence of silicon.

As an option, a largest growth surface of the material is oriented substantially on a {100} plane.

BRIEF DESCRIPTION OF DRAWINGS

Non-limiting embodiments will now be described by way of example and with reference to the accompanying drawings in which.

DETAILED DESCRIPTION

Large area substrates are required in order to grow large area single crystal CVD synthetic diamond. As discussed above, large area single crystal diamond can be grown using techniques such as heteroepitaxial growth. Heteroepitaxially grown diamond typically has a high density of dislocations. For example, type Ib single crystals typically have between $10^4$ and $10^6$ dislocation per cm$^2$. In contrast, figures of greater than $10^7$ dislocations per cm$^2$ have been reported for heteroepitaxially grown diamond in Shreck et al., Appl. Phys. Lett. 78, 192 (2001). However, even diamond with such a high dislocation density can be used for some applications including heat spreading, optical applications, machining applications and synthetic gemstones. However, an even greater range of applications can be addressed if the heteroepitaxially grown CVD diamond is separated from its non-diamond substrate and itself used as a substrate for further CVD growth.

Figure 1:
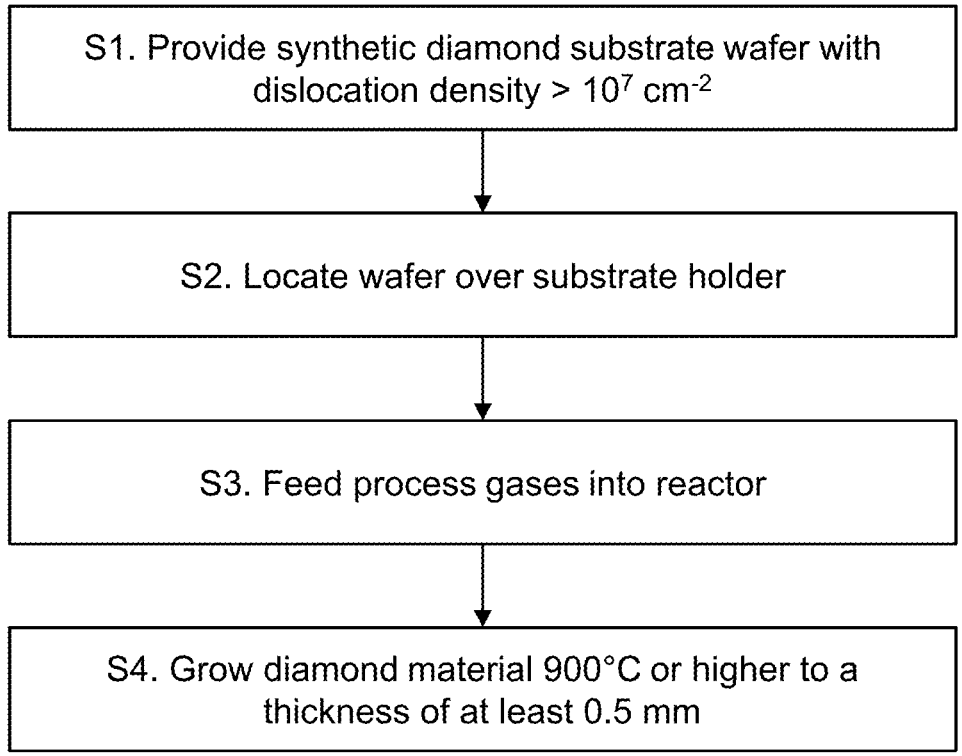
FIG. 1 is a flow diagram showing exemplary steps to produce CVD single crystal synthetic diamond material.

FIG. 1 herein is a flow diagram showing exemplary steps to produce CVD single crystal synthetic diamond material. The following numbering corresponds to that of FIG. 1.

S1. A freestanding synthetic single crystal diamond substrate wafer is provided. The substrate wafer has a dislocation density of at least $10^7$ cm$^{-2}$ as measured by counting etch pits in a given surface area after applying an oxygen plasma etch. An example of such a wafer is one that is prepared by heteroepitaxial growth. In some cases, it may be advantageous to process a surface of the substrate wafer to reduce surface damage. Examples of processing include polishing, chemical mechanical polishing, etching, and laser processing. Processing may also include removing a non-diamond material from the single crystal diamond substrate wafer.

S2. The substrate wafer is located over a substrate holder within a CVD reactor.

S3. Process gases are fed into the reactor. Such process gases typically include methane and hydrogen and a plasma is formed.

S4. Synthetic diamond is grown at a temperature of at least 900° C. on a surface of the substrate wafer to a thickness of at least 0.5 mm. The growth process may use a power density sufficient to achieve a growth rate of at least 4 μm per hour.

After the synthetic diamond has been grown, the reactor substrate holder may be processed to ensure that its surface is clean and to maintain a profile of a supporting surface of the substrate holder. A height of the substrate holder within the reactor may be adjusted to ensure reproducibility between synthetic diamond growth runs.

Figure 2:
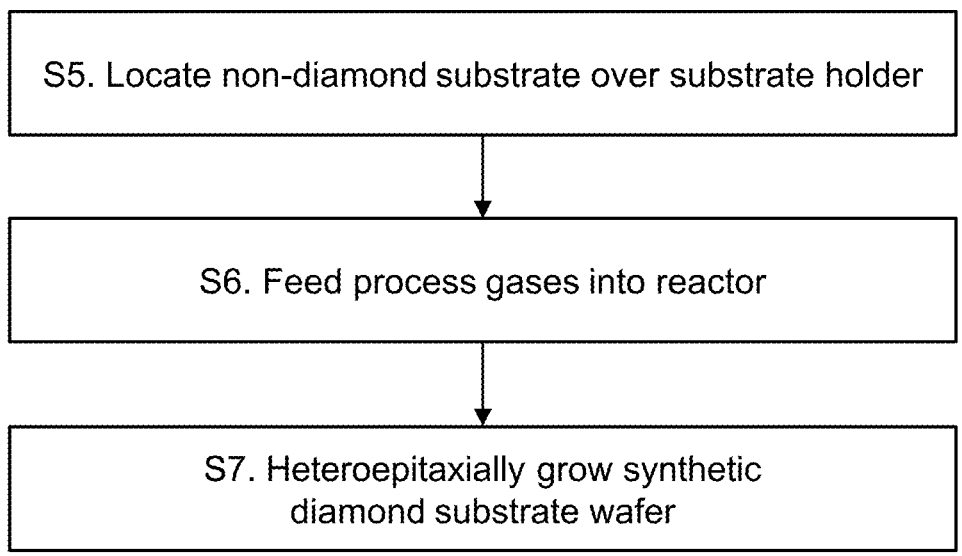
FIG. 2 is a flow diagram showing exemplary steps to produce a synthetic diamond wafer on which to grow further synthetic diamond material.

FIG. 2 is a flow diagram showing steps of an exemplary method to obtain a synthetic diamond substrate with a dislocation density of at least $10^7$ cm$^{-2}$. The following numbering corresponds to that of FIG. 2.

S5. A non-diamond substrate is located over a substrate holder within a reactor, the non-diamond substrate comprising a surface on which the synthetic single crystal diamond substrate wafer is to be grown heteroepitaxially. Examples of a non-diamond substrate include any of iridium, silicon and silicon carbide.

S6. Process gases (typically methane and hydrogen) are fed into the reactor and a plasma is formed.

S7. The synthetic single crystal diamond substrate wafer is then grown on a surface of the non-diamond substrate.

It should be noted that while the above description refers to growing single crystal synthetic diamond on a heteroepitaxially grown single crystal synthetic diamond wafer substrate, other types of single crystal diamond wafer substrates may be used.

Growth on large area single crystal synthetic diamond wafer substrates can be problematic owing to stresses building up and cracking the synthetic diamond. This can be alleviated to a certain extent by any of the following techniques:

1. Subsurface damage can be removed from the single crystal synthetic diamond wafer substrates before growth. This can be done, for example, by scaife polishing.

2. Subsurface damage can be removed from the single crystal synthetic diamond wafer substrates before growth by plasma etching, such as inductively coupled plasma etching, as described in Diamond and Related Materials, 18, 808-815 (2009).

CVD synthesis conditions are typically controlled such that the freestanding single crystal synthetic diamond wafer substrate is held at a temperature of at least 900° C. If the temperature of the growth substrate is too low then growth rates are low. An upper limit to the growth temperature of 1200° C. is generally required to avoid detrimental defect formation in the CVD layer, such as twins. Furthermore, the substrate temperature, in combination with other parameters such as carbon containing gas concentration, affects the morphology of the growing single crystal CVD synthetic diamond material and thus can be selected and controlled to achieve a desired morphology.

The inventors have discovered that, for CVD growth on substrates with a high dislocation density, such as those observed in heteroepitaxial diamond, to avoid cracking of the growing CVD diamond, a temperature above 900° C., is required. Without being bound by any specific theory, it is suggested that such conditions lead to a reduction of the difference in strain between the high dislocation density substrate and the overgrown CVD layer.

CVD synthesis conditions are controlled such that a CVD synthesis atmosphere comprises a carbon containing gas (e.g. methane) at a concentration by volume in a range 3 to 8%, more preferably in a range 4 to 6%. If the carbon containing gas concentration is too low then growth rates are too low. If the carbon containing gas concentration is too high then cracking may occur and/or the material may have a poor optical quality. Furthermore, as previously stated, carbon containing gas concentration, in combination with other parameters such as the substrate temperature, affects the morphology of the growing single crystal CVD synthetic diamond material and thus is selected and controlled to achieve the desired morphology close to net shape of the final processed product.

CVD synthesis conditions are further controlled to provide a high power density across the substrate of at least 150 W/cm$^2$, 180 W/cm$^2$, 200 W/cm$^2$, 230 W/cm$^2$, 250 W/cm$^2$, 270 W/cm$^2$, 290 W/cm$^2$, 310 W/cm$^2$, or 330 W/cm$^2$. The power density will generally be less than 600 W/cm$^2$, 500 W/cm$^2$, or 400 W/cm$^2$. In the context of this specification, power density is defined as the total microwave input power divided by the area of the substrate, or the substrate holder, whichever has the greater area.

The CVD synthesis conditions are controlled such that the single crystal CVD synthetic diamond material is grown at a growth rate of at least 5 µm/hr, 6 µm/hr, 7 µm/hr, 8 µm/hr, 9 µm/hr, 10 µm/hr, 11 µm/hr, 13 µm/hr, 16 µm/hr, or 19 µm/hr. The growth rate will generally be less than 40 µm/hr, 30 µm/hr, or 25 µm/hr. While high growth rates are desired for economic reasons, if the material grows too quickly it can be of poor optical quality and may be prone to cracking.

In addition to the above, high, axially oriented, process gas flow rates can be used to further increase growth rates. For example, CVD synthesis conditions can be controlled such that a total process gas flow rate is at least 0.5, 1, 3, 5, 10, 15, 20, or 25 standard litres per minute as described, for example, in WO 2012/084656. Generally, total process gas flow rate will not usually exceed 100 standard litres per minute.

CVD synthesis conditions are controlled such that the single crystal CVD synthetic diamond material is grown to a thickness of at least 0.5 mm, 0.8 mm, 1.0 mm, 1.3 mm, 1.5 mm, 2 mm, or 2.5 mm and that a processed product can be fabricated which has a thickness of at least 0.5 mm, 0.8 mm, 1.0 mm, 1.3 mm, 1.5 mm, 2 mm, or 2.5 mm. The upper limit for the thickness of the single crystal CVD synthetic diamond product will depend on its end application but will generally be no more than 10 mm. The as-grown single crystal CVD synthetic diamond material can then be processed. Processing includes surface processing to convert the as-grown material into a product. Examples of processing techniques include one or more of cutting, cleaving, lapping, polishing, and/or etching. Each processed single crystal CVD synthetic diamond may be formed from at least 50%, 60%, 70%, 80%, or 90% by volume of its associated as-grown single crystal CVD synthetic diamond.

The following examples illustrate ways in which single crystal synthetic diamond material can be produced:

EXAMPLE 1

Heteroepitaxially grown single crystal synthetic diamond was obtained having and a dislocation density on a surface over $10^7$ cm$^{-2}$. This material was used as a freestanding synthetic single crystal diamond substrate wafer, and did not include any non-diamond material such as a silicon substrate. The dislocation density was measured by applying an oxygen-containing plasma to the surface of the diamond. This forms etch pits that reveal the presence of dislocations. The number of etch pits in a predetermined area are counted to determine the dislocation density.

The freestanding synthetic single crystal diamond substrate wafer was placed in a microwave CVD reactor and diamond was grown on a surface of the freestanding synthetic single crystal diamond substrate wafer using a feed gas of methane and hydrogen, a power in a range of 3 to 60 kW, a pressure in a range of 90 to 400 torr and a growth temperature in a range of 900° C. to 1050° C. The feed gas contained 0.6 ppm N$_2$. The resultant single crystal synthetic diamond was grown to a thickness of greater than 0.5 mm.

The single substitutional nitrogen content [$N_s^0$] of the grown single crystal diamond was measured using UV-Visible absorption spectroscopy (described in WO 03/052177), and found to be 150 ppb. The single substitutional nitrogen content [$N_s^0$] can also be measured by electron paramagnetic resonance (EPR).

Birefringence was measured using a technique similar to that described in WO 2004/046427 using a pixel size area in a range of 1×1 µm² to 20×20 µm². A maximum |sin δ| was found to be around 0.8 for light having a wavelength of 550 nm using a sample of 3×3×0.5 mm. The $\Delta n_{[average]}$, the average value of the difference between the refractive index for light polarised parallel to the slow and fast axes averaged over the sample thickness, was found to be $1.6 \times 10^{-4}$.

EXAMPLE 2

Heteroepitaxially grown single crystal synthetic diamond was obtained having a dislocation density on a growth surface of greater than $10^7$ cm$^{-2}$. This material was used as a freestanding synthetic single crystal diamond substrate wafer, and did not include any non-diamond material such as a silicon substrate.

The freestanding synthetic single crystal diamond substrate wafer was placed in a microwave CVD reactor and diamond was grown on a surface of the freestanding synthetic single crystal diamond substrate wafer using a feed gas of methane and hydrogen, and a power, pressure and temperature in the same ranges as described in Example 1. The feed gas contained 2.9 ppm $N_2$. The resultant single crystal synthetic diamond was grown to a thickness of greater than 0.5 mm.

The single substitutional nitrogen content $[N_s^0]$ of the grown single crystal diamond was found to be 150 ppb. Birefringence was measured using a pixel size area in a range of 1×1 µm² to 20×20 µm². A maximum |sin δ| was found to be around 0.8 for light having a wavelength of 550 nm using a sample of 3×3×0.5 mm. The $\Delta n_{[average]}$, the average value of the difference between the refractive index for light polarised parallel to the slow and fast axes averaged over the sample thickness, was found to be $1.6 \times 10^{-4}$.

EXAMPLE 3

A set of five heteroepitaxially grown CVD diamond substrates were used for subsequent CVD diamond synthesis. The substrates were of size 4.0×4.0×0.3 mm³ and of nominally the same defect concentrations. All faces of the substrates were {100} and were scaife polished in order to produce a low damage surface finish.

A selection of representative substrates were subjected to an oxygen-containing plasma etch in order to form etch pits and thus reveal the presence of the dislocations. Using this method, the dislocation density at the growth face of the substrate was estimated to be greater than $10^8$ cm$^{-2}$.

These substrates were included in a series of CVD diamond synthesis runs in a 2.45 GHz microwave plasma CVD diamond reactor and using a mixture of hydrogen, argon, methane and nitrogen feed gases, in which the only process parameter varied run-to-run was the substrate temperature. The process conditions used (other than substrate temperature were: power density=224 W cm$^{-2}$; pressure 230 Torr; hydrogen flow=600 sccm; methane flow=40 sccm; argon flow=20 sccm; nitrogen gas phase concentration=3 ppm. A number of heteroepitaxial substrates were included in each run.

After CVD diamond synthesis, all stones were imaged using a low power optical microscope and the number of major cracks visible were counted. In addition, the CVD growth thickness was measured. From these values, an average number of cracks and an average thickness was calculated. These values are shown in Table 1. For synthesis run 3.1 (having lowest growth temperature) the crack density was such that only an estimate was possible.

TABLE 1

| | Example 3 | | |
|---|---|---|---|
| Example | Substrate temperature (° C.) | Average CVD growth thickness (mm) | Average number of macroscopic cracks |
| 3.1 | 800 | 1.4 | >20 |
| 3.2 | 870 | 1.7 | 6.7 |
| 3.3 | 890 | 1.7 | 3.0 |
| 3.4 | 925 | 1.8 | 0 |
| 3.5 | 950 | 1.6 | 0 |

Growth rates of between 4 µm per hour and 16 µm per hour were observed. These growth rates may be improved by altering the temperature, pressure and gas chemistry.

It can be seen that having a growth temperature of at least 900° C. eliminated the number of cracks that could be measured.

Diamond temperature during growth was measured using a one-colour pyrometer operating at 2.2 µm and assuming a diamond emissivity of 0.9. Diamond emissivity changes with temperature, but the method gives repeatable results. The diamond wafer substrate is brazed to a carrier. During growth, polycrystalline diamond forms on the carrier. The pyrometer is aimed at the polycrystalline material next to the single crystal diamond.

Figure 3:
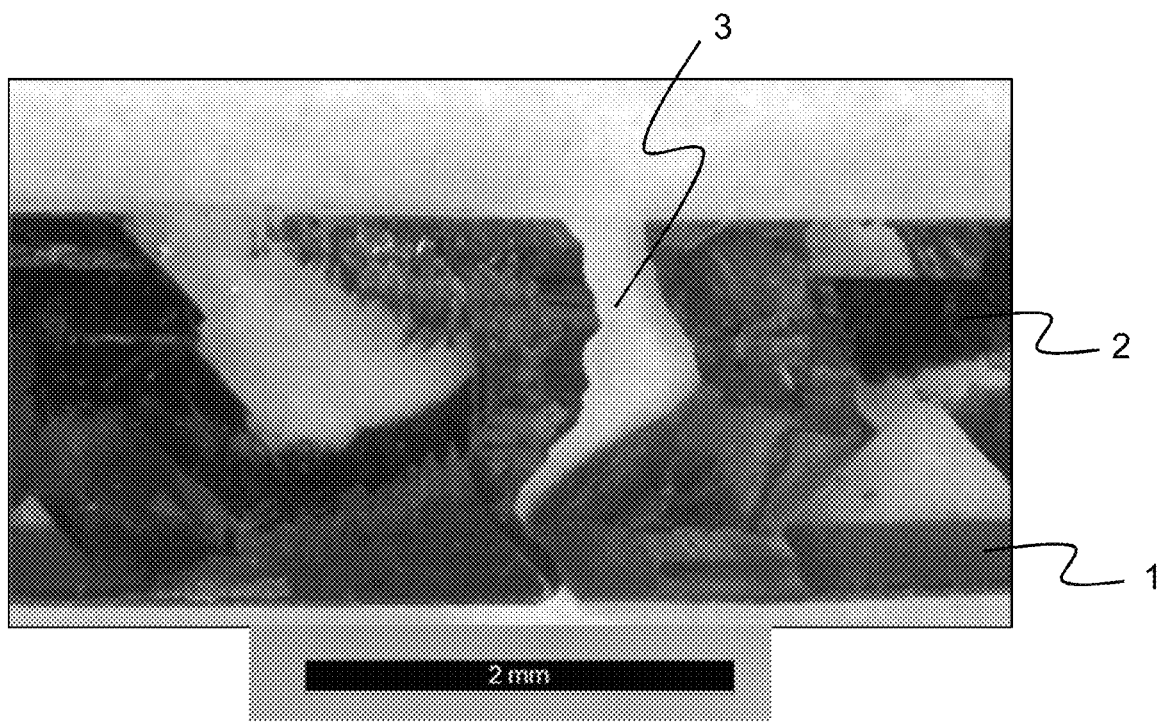
FIG. 3 is a micrograph of a side elevation cross section of exemplary diamond material.

FIG. 3 shows a side elevation cross section of Example 3.2, grown at 870° C. The sample consists of the single crystal diamond substrate wafer 1 and the grown synthetic diamond material 2. Several cracks can be seen in the synthetic diamond material 2, including a very large crack 3.

Figure 4:
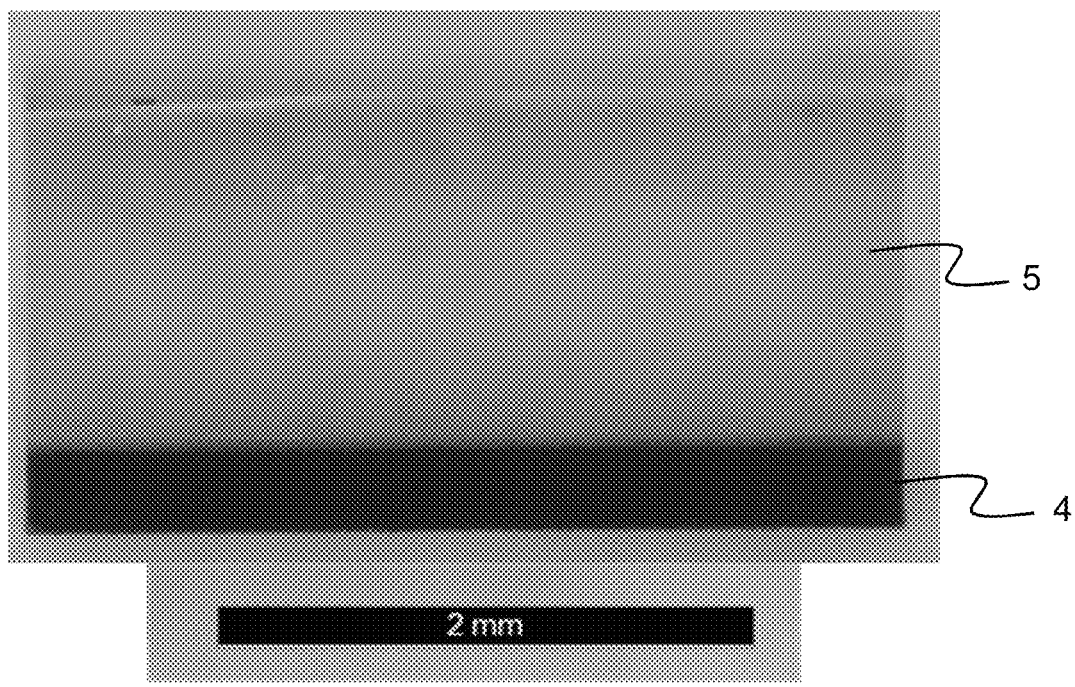
FIG. 4 is a micrograph of a side elevation cross section of further exemplary diamond material.

FIG. 4 shows a side elevation cross section of Example 3.5, grown at 950° C. The sample consists of the single crystal diamond substrate wafer 4 and the grown synthetic diamond material 5. It can be seen that the synthetic diamond material 5 material is crack free.

The single substitutional nitrogen content of the samples was measured by UV-Vis and found to vary between 140 and 160 ppb. The silicon concentration for all of the samples was no more than $5 \times 10^{17}$ atoms/cm³. The presence of silicon is further indicated by a photoluminescence peak in diamond at 737 nm using a 660 nm laser excitation source at 77 K. The ratio of area of this peak to the area of the Raman peak was found to be no more than 10. In some samples it was found to be no more than 0.1

Considering example 3.4, where no cracks were observed, an alpha parameter of 1.32 was measured. The alpha parameter is defined as $$\alpha = \sqrt{3} \frac{GR_{100}}{GR_{111}}$$

Where $GR_{100}$ is the linear growth rate in the <100> direction and $GR_{111}$ is the linear growth rate in the <111> direction. This is described in more detail in Silva et. al., Journal of Crystal Growth 310 (2008) 187-2003. The growth parameter can be used to predict and optimise factors such as the growth rate, largest usable diamond surface area and so on, and be used to control diamond crystal morphology during growth, which in turn can be used to minimise stresses within a single crystal diamond. {111} growth faces can appear at the corners of the growing diamond material leading to certain structural defects, and so it is desirable that the {100} planes grow in preference to the {111} planes.

A number of potential applications are envisaged for the product as described herein. For example, the single crystal CVD synthetic diamond material may be used to form an optical prism or a mechanical tool component with the tip forming a cutting edge or point.

While this invention has been particularly shown and described with reference to embodiments, it will be understood by those skilled in the art that various changes in form and detail may be made without departing from the scope of the invention as defined by the appended claims. For example, while the examples describe a heteroepitaxially grown diamond substrate, other single crystal diamond material substrates could be used. Furthermore, where the above description refers to the diamond being grown on a carrier with a spacer to form a gas gap, it is thought to be possible to do away with a carrier altogether and just provide the diamond substrate on spacers to form a gas gap.

What is claimed is:

1. A method of manufacturing synthetic single crystal diamond material using a chemical vapour deposition process, the method comprising:
    locating a non-diamond substrate over a substrate holder within a first chemical vapour deposition reactor, the substrate comprising a surface on which the synthetic single crystal diamond substrate wafer is to be grown heteroepitaxially;
    feeding process gases into the first chemical vapour deposition reactor;
    growing the synthetic single crystal diamond substrate wafer on the surface of the non-diamond substrate;
    locating the synthetic single crystal diamond substrate wafer over a substrate holder within a second chemical vapour deposition reactor;
    feeding process gases into the second chemical vapour deposition reactor, the process gases including a gas comprising carbon; and
    growing synthetic diamond material on a surface of the single crystal diamond substrate wafer to a thickness of at least 0.5 mm and with a largest lateral linear dimension of at least 4 mm such that the grown synthetic diamond material is crack free.

2. The method according to claim 1, wherein the synthetic single crystal diamond substrate wafer has a surface dislocation density selected from any of at least $1 \times 10^6$ cm$^{-2}$, at least $2 \times 10^6$ cm$^{-2}$, at least $5 \times 10^6$ cm$^{-2}$, and at least $1 \times 10^7$ cm$^{-2}$.

3. The method according to claim 1, wherein a growth temperature is selected from any of at least 900° C., at least 925° C., at least 950° C., at least 1000° C. and at least 1050° C.

4. The method according to claim 1, wherein the process gases comprise hydrogen and not more than 5% oxygen.

5. The method according to claim 1, wherein the non-diamond substrate comprises any of iridium, sapphire, silicon and silicon carbide.

6. The method according to claim 1, further comprising removing the non-diamond substrate from the synthetic single crystal diamond substrate wafer prior to locating the synthetic single crystal diamond substrate wafer over the substrate holder.

7. The method according to claim 1, wherein the grown synthetic diamond material is oriented at substantially {100} relative to the synthetic single crystal diamond substrate wafer.

8. The method according to claim 1, wherein the chemical vapour deposition reactor is operated at a power density in a range of 150 to 600 Wcm$^{-2}$ of the surface of the substrate.

9. The method according to claim 1, comprising growing the synthetic diamond material having an area from 16 mm$^2$ to 18000 mm$^2$.

* * * * *